US006717470B1

(12) United States Patent
Bowers

(10) Patent No.: US 6,717,470 B1
(45) Date of Patent: Apr. 6, 2004

(54) VOLTAGE AMPLIFIER WITH OUTPUT STAGES HAVING HIGH CAPACITIVE LOAD TOLERANCE

(75) Inventor: Derek F. Bowers, Los Altos Hills, CA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/139,310

(22) Filed: May 6, 2002

(51) Int. Cl.[7] .................................................. H03F 3/26

(52) U.S. Cl. ........................ 330/255; 330/264; 330/265
(58) Field of Search ................................. 330/255, 264, 330/265, 240, 242

(56) References Cited

U.S. PATENT DOCUMENTS 5,585,763 A * 12/1996 Navabi et al. ............... 330/255

OTHER PUBLICATIONS

Wu et al., "Digital–Compatible High Performance Operational Amplifier with Rail–to–Rail Input and Output Ranges", IEEE Journal of Solid–State Circuits, vol. 29, No. 1, Jan. 1994, pp. 63–66.

Monticelli, "A Quad CMOS Single–Supply Op Amp with Rail–to–Rail Output Swing", IEEE Journal of Solid–State Circuits, vol. SC–21, No. 6, Dec. 1986, pp. 1026–1034.

* cited by examiner

Primary Examiner—Steven J. Mottola
(74) Attorney, Agent, or Firm—Koppel, Jacobs, Patrick & Heybl

(57) ABSTRACT

A voltage amplifier circuit inhibits excessive output phase shifts from a voltage amplifier that could result in oscillation, while still providing for rail-to-rail outputs. A first output stage that includes a blocking impedance dominates the output for low output values, while a second output stage that excludes the blocking impedance dominates for higher output voltages up to rail-to-rail. The output stages are preferably implemented with CMOS transistors, with the relative sizes of the transistors and the resistance of the blocking resistor selected to enable both phase shift inhibition and rail-to-rail outputs. The first output stage provides more AC feedback, while the second output stage provides more DC feedback for high output voltages.

37 Claims, 2 Drawing Sheets

VOLTAGE AMPLIFIER WITH OUTPUT STAGES HAVING HIGH CAPACITIVE LOAD TOLERANCE

BACKGROUND OF THE INVENTION

1. Field of the Invention

This invention relates to voltage amplifiers, and more particularly to voltage amplifiers intended to drive high output capacitive loads with rail-to-rail amplification.

2. Description of the Related Art

With conventional voltage amplifiers such as operational amplifiers having dominant pole compensation, at least a 90° phase shift is produced in the output signal at all but the lowest frequencies, due to the use of an internal compensation capacitor. (The term "phase shift" as used herein refers to the shift from the ideal output signal phase. Since an op amp with a feedback loop connected to its inverting input is intended to produce a 180° phase shift between the input and output, the term "180° phase shift" as used herein thus refers to the input signal actually being in-phase with the output signal.) Such an operational amplifier (op amp) circuit is illustrated in simplified form in FIG. 1. The op amp 2 includes non-inverting 4 and inverting 6 inputs, with its output resistance represented by internal resistor Ro. It is operated off positive and negative reference voltage terminals V$^+$ and V$^-$ such as 5 volts and ground. An input signal Vin is applied to the non-inverting input terminal 4, while a feedback resistor Rfb is connected between its output terminal 10 and the inverting input 6. A gain resistor Rgain is typically connected between the inverting input and ground, establishing the magnitude of the output signal Vo in accordance with the ratio between Rfb and Rgain.

The load connected to the output terminal 10 typically includes a resistive component Rl and a capacitive component Cl. The latter impedance typically includes stray capacitive loads associated with printed circuit traces, connectors, coaxial cable, etc.

For practical amplifiers, the phase shift at the output is typically considerably more than 90°, due in part to the op amp's output resistance. Also, some op amps appear inductive at the output, causing the stray capacitive load to further contribute to output phase shift. If the total phase shift is 180° or more when the loop gain is greater than unity, the amplifier's negative feedback becomes positive and oscillation results.

While the op amp may be intended for relatively low frequency inputs, such as signals up to about 100 KHz, the oscillation can be at many different frequencies, including high frequencies of 500 KHz or more, depending upon numerous factors such as the amount of load capacitance applied to the circuit. The purpose of the compensation capacitor Ccomp is to roll off the amplifier gain to below unity before the phase shift exceeds 180°, but the additional sources of phase shift discussed above can frustrate this goal and still lead to oscillation.

One prior attempt to prevent such oscillation is illustrated in FIG. 2, which adds a blocking resistor Rbl between the output of amplifier 2 and the load impedance.

While the addition of a blocking resistor has been found to successfully reduce the output phase shift, at the same time it increases the output resistance and thereby reduces the range of the output voltage swing to noticeably less than the difference between V$^+$ and V$^-$, which is commonly called the "rail-to-rail" range. In another prior circuit, illustrated in FIG. 3, the connection for the feedback resistor Rfb is moved to the opposite side of the blocking resistor Rbl from the output of op amp 2, and a feedback capacitor Cfb is connected between the op amp output and the inverting input 6. With this circuit the feedback capacitor Cfb presents a high impedance or open circuit at low frequencies, placing the blocking resistor Rbl inside the feedback loop in series with feedback resistor Rfb. At high frequencies, on the other hand, Cfb presents a significantly lower impedance than Rfb, establishing the primary feedback path through Cfb and effectively placing Rbl outside the feedback loop, where it can still reduce the phase shift due to the load capacitance Cl. Cfb reduces the gain at medium to high frequencies, but this effect can be reduced by adding some resistance in series with Cfb.

While Rbl does not reduce the output phase shift due to Cl for low frequencies at which it is effectively inside the amplifier feedback loop, the phase shift due to Cl is small for low frequencies. Rbl does not increase the output resistance at low frequencies, but its effective series connection with Rl in the low frequency range results in a voltage drop across Rbl that reduces the voltage swing for Vo to a range significantly less than the rail-to-rail range at high load currents.

An op amp with a conventional CMOS output stage that yields a rail-to-rail output voltage swing is illustrated in FIG. 4. This general type of circuit is described in Wu et al., "Digital-Compatible High Performance Operational Amplifier with Rail-to-Rail Input and Output Ranges", IEEE Journal of Solid-State Circuits, Vol. 29, No. 1, January 1994, pages 63–66, and Monticelli, "A Quad CMOS Single-Supply Op Amp with Rail-to-Rail Output Swing", IEEE Journal of Solid-State Circuits, Vol. SC-21, No. 6, December 1986, pages 1026–1034. The complementary positive and negative op amp outputs 12 and 14 are connected to the gates of p-channel MOS transistor P0 and n-channel MOS transistor N0, respectively. The source-drain circuit of P0 is connected between V$^+$ and the Vo terminal, while the drain-source circuit of N0 is connected in series with the source-drain circuit of P0 between the Vo terminal and V$^-$. While this circuit achieves a substantially rail-to-rail output voltage swing, it is still subject to output phase shifts that can reach 180° and thus produce positive feedback oscillation.

SUMMARY OF THE INVENTION

The present invention seeks to provide a new voltage amplifier circuit that both inhibits oscillation due to positive feedback, and achieves a rail-to-rail output voltage swing.

This goal is achieved by providing a pair of output stages for the voltage amplifier, with one stage including a blocking impedance and dominating for low values of output voltage at which a rail-to-rail swing is not required, and the second output stage excluding the blocking impedance and dominating for high values of output voltage at which rail-to-rail operation may be desired.

In a preferred implementation of the invention with CMOS output stages, the first output stage provides more AC feedback than the second stage, while the second stage provides DC feedback with an output voltage range approximating rail-to-rail. Further details of a particular implementation include providing the blocking impedance as a resistor connected between the two output stages, with the first and second output stages connected respectively through a feedback capacitor and a feedback resistor to the voltage amplifier. The CMOS transistors of the second stage are larger in size than the first stage transistors, with the size ratio between the transistors sufficient to place the second stage transistors in their linear range when that stage becomes dominant, thereby preventing oscillation. The resistance value of the blocking resistor is also high enough to inhibit oscillation, but small enough so that the second stage transistors are in their linear range when that stage becomes dominant.

These and other features and advantages of the invention will be apparent to those skilled in the art from the following detailed description, taken together with the accompanying drawings.

DETAILED DESCRIPTION OF THE INVENTION

Figure 1:
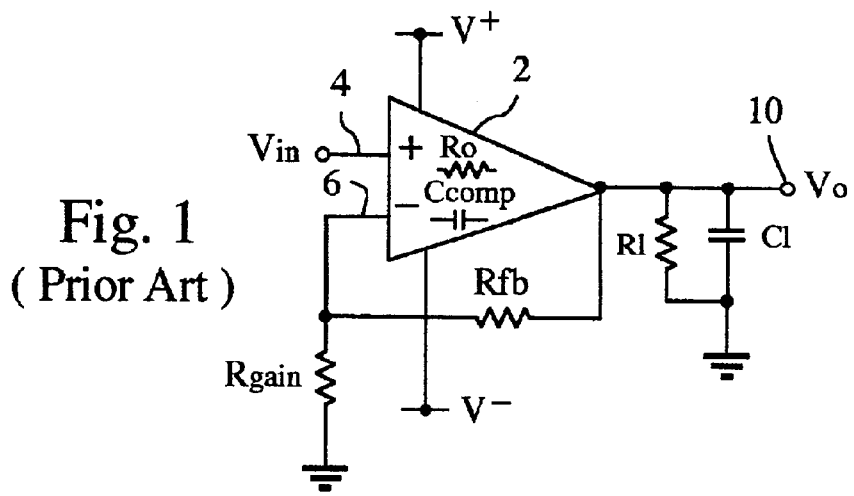
FIG. 1 is a partially block and partially schematic diagram of a conventional op amp circuit.
Figure 2:
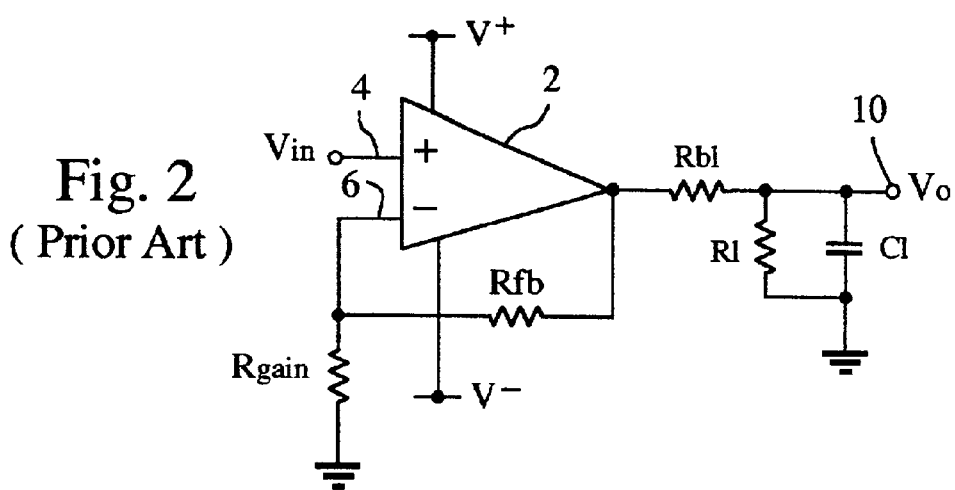
FIG. 2 is a partially block and partially schematic diagram of a prior op amp circuit with a blocking resistor that prevents oscillation at the cost of reducing output voltage swings.
Figure 3:
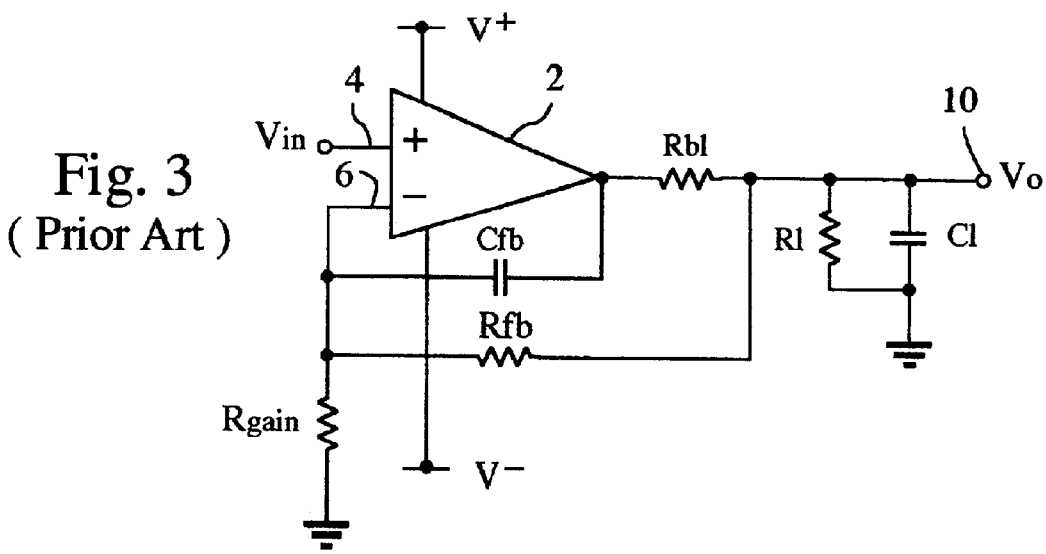
FIG. 3 is a partially block and partially schematic diagram of a prior op amp circuit with an output stage that inhibits oscillation but still reduces the output voltage swing at high load current levels.
Figure 4:
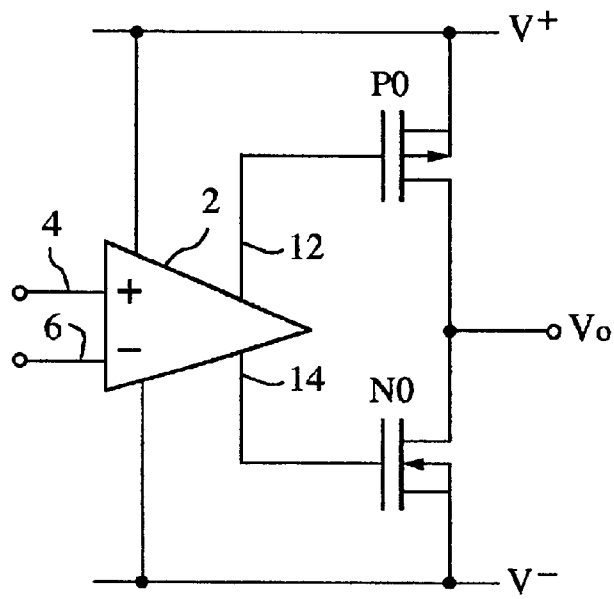
FIG. 4 is a partially block and partially schematic diagram of a prior op amp with a CMOS rail-to-rail output stage.
Figure 5:
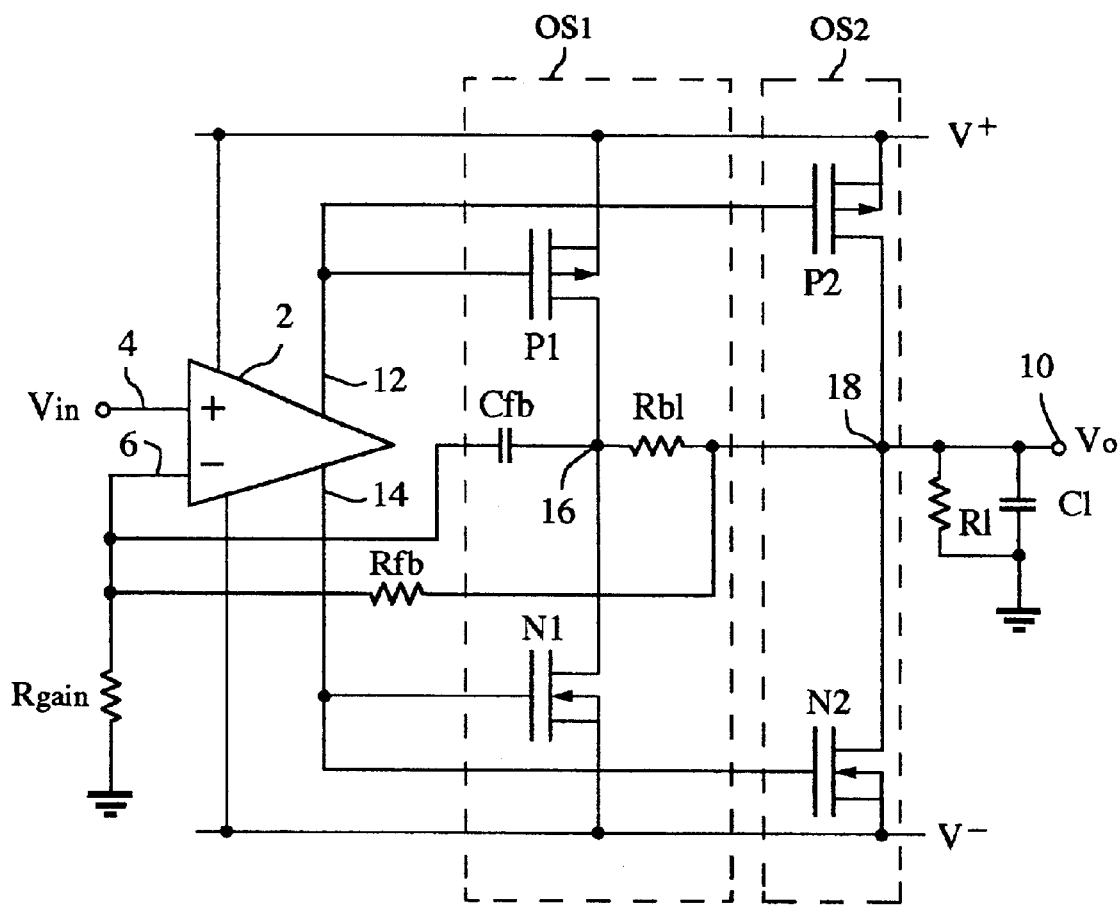
FIG. 5 is a partially block and partially schematic diagram of a voltage amplifier circuit in accordance with the present invention that both inhibits oscillation, and makes possible a rail-to-rail output voltage swing.

While the present invention is applicable to negative feedback voltage amplifiers in general that are subject to oscillation, the preferred application is in connection with op amps for which a rail-to-rail output is desired. (The term "rail-to-rail" as used herein does not require an absolute matching of the voltage differential between V⁺ and V⁻, but only an approximate match.) Such a circuit is shown in FIG. 5, in which elements common to the circuits of FIGS. 1–4 are identified by the same reference numerals and abbreviations.

The overall amplifier circuit includes first and second output stages OS1 and OS2. OS1 includes complementary PMOS and NMOS transistors P1 and N1 with their gates connected respectively to the positive and negative outputs 12 and 14 of op amp 2. The source-drain circuit of P1 is connected in series with the drain-source circuit of N1 between V⁺ and V⁻. The P1/N1 junction 16 is connected in a capacitive feedback loop through capacitor Cfb to the inverting input 6 of op amp 2, and in a resistive feedback loop through blocking resistor Rbl and feedback resistor Rfb to the inverting op amp input.

The second output stage OS2 comprises complementary PMOS and NMOS transistors P2 and N2, with the source-drain circuit P2 connected in series with the drain-source circuit of N2 between V⁺ and V⁻. The P2/N2 junction 18 is connected to the opposite side of blocking resistor Rbl from the P1/N1 junction 16, and provides the amplifier circuit's output terminal 10. The gate of P2 is connected in common with the gate of P1 to the positive output of op amp 2, while the gate of N2 is connected in common with the gate of N1 to the op amp's negative output.

The operation of the new amplifier circuit is as follows. The load resistance Rl draws in-phase current across the blocking resistor Rbl which is desirable, while the load capacitance Cl draws out-of-phase current across Rbl, which is undesirable. At high oscillation frequencies Rl and Cl both draw current, producing a, voltage drop across Rbl. (The term "oscillation frequency" as used herein refers to the frequency at which oscillation would occur in the absence of this invention, and is dependent upon both the amplifier itself and its load.) However, the voltage at the first stage junction 16 is still largely in-phase because Rbl mostly blocks the effects of Cl, allowing Cfb to provide a desirable in-phase feedback. At low oscillation frequencies Cfb effectively disappears, establishing the effective feedback through Rfb and placing Rbl inside the feedback loop so that it does not increase the output impedance. Actual input signals to the op amp are normally in a "low" frequency range, such as 100 KHz or less, so with oscillation inhibited by the invention any voltage drop across Rbl is kept small.

As Vo approaches V⁺ or V⁻ the output current through R1 similarly increases, with a portion flowing through Rbl depending upon the relative sizes of the second stage transistors P2 and N2 relative to the sizes of the first stage transistors P1 and N1. As the relative sizes of P2 and N2 increase, less current is transmitted through Rbl. Therefore Rbl has to have a resistance value high enough to avoid excessive phase shifts at higher values of Vo.

At low values of Vo, at which little current flows through Rbl, the first output stage transistors P1 and N1 dominate in controlling the output voltage. However, at high values of Vo, the second output stage transistors P2 and N2 dominate in controlling the output. At high output levels the feedback through Cfb is effectively reduced, or disappears entirely, because P1 and N1 no longer dominate in controlling the output. However, this does not cause oscillation, as might normally be expected, if P2 and N2 can be kept in their linear regions, at which their low gains result in a low gain for the overall amplifier and therefore no oscillation.

Summarizing the considerations for the selection of a particular resistance value for Rbl and the size ratio between the second and first stage CMOS transistors, Rbl must be sufficiently large to inhibit excessive output phase shift, but not so large that it causes the voltage at the first stage terminal 16 to hit a rail value prematurely when driving a resistive load. If this happens, P2 and N2 may not be in their linear regions, and oscillation may result.

With respect to the size ratio between P2, N2 and P1, N1, if the ratio is too large there may be excessive output phase shift, while if it is too small P1 and N1 may loose control of the output too quickly, before P2 and N2 are in their linear regions.

In a particular implementation of FIG. 5, component values were selected as follows:

Rbl:1.0 kohm
Rfb:10.0 kohm
Cfb:5.0 pf
Rgain:20.0 kohm
P1:400 microns wide, 4 microns long
N1:150 microns wide, 4 microns long
P2:4,000 microns long, 4 microns wide
N2:1,500 microns long, 4 microns wide While a particular embodiment of the invention has been shown and described, numerous variations and alternate embodiments will occur to those skilled in the art. For example, while a CMOS implementation of the invention has been discussed, it could also be implemented with bi-polar transistors by adding circuitry to inhibit the very large increase in base current and transistor saturation that would normally occur near the rail voltages with bipolar devices. Accordingly, it is intended that the invention be limited only in terms of the appended claims.

I claim:

1. A voltage amplifier circuit for producing an output voltage (Vo) at an amplifier circuit output, comprising:
   a voltage amplifier,
   a blocking impedance,
   first and second output stages between the output of said voltage amplifier and said amplifier circuit output, said first output stage including said blocking impedance and dominating for low values of Vo, and said second output stage excluding said blocking impedance and dominating for high values of Vo,
   an AC feedback circuit between said first output stage and said voltage amplifier, and
   a DC feedback circuit between said second stage and said voltage amplifier,
   said blocking impedance connected to block load capacitance from said AC feedback circuit during high frequency operation, and to enter said DC feedback circuit during low frequency operation so that it does not increase the voltage amplifier circuit's output impedance.

2. The voltage amplifier circuit of claim 1, further comprising voltage reference terminals for said output stages, said output stages comprising respective pairs of CMOS transistors connected between said voltage reference terminals and controlled by said voltage amplifier output, said blocking impedance connected between said second output stage and the remainder of said first output stage.

3. The voltage amplifier circuit of claim 2, wherein said blocking impedance comprises a resistor that has a resistance value high enough to inhibit a phase shift at the output of said voltage amplifier relative to its input that could result in oscillation, but small enough so that the transistors of said second output stage are in their linear range when said stage is dominant.

4. The voltage amplifier circuit of claim 2, wherein said first output stage is connected to said amplifier circuit output through said blocking impedance.

5. The voltage amplifier circuit of claim 2, wherein the CMOS transistors of said second output stage are larger in size than the CMOS transistors of said first output stage.

6. The voltage amplifier circuit of claim 5, wherein the size ratio between the transistors of said second output stage and the transistors of said first output stage is sufficient for the transistors of said second output stage to be in their linear range when said stage is dominant.

7. A voltage amplifier circuit for producing an output voltage (Vo) at an amplifier circuit output, comprising:
   a voltage amplifier,
   a blocking impedance,
   first and second output stages between the output of said voltage amplifier and said amplifier circuit output, said first output stage including said blocking impedance and dominating for low values of Vo, and said second output stage excluding said blocking impedance and dominating for high values of Vo,
   voltage reference terminals for said output stages, said output stages comprising respective pairs of CMOS transistors connected between said voltage reference terminals and controlled by said voltage amplifier output, said blocking impedance connected between said second output stage and the remainder of said first output stage, and
   a resistive feedback circuit between said amplifier circuit output and said voltage amplifier, and a capacitive feedback circuit between the opposite side of said blocking impedance from said amplifier circuit output and said voltage amplifier.

8. The voltage amplifier circuit of claim 7, said voltage amplifier comprising an operational amplifier.

9. The voltage amplifier circuit of claim 1, said blocking impedance comprising a resistor.

10. A voltage amplifier circuit for producing an output voltage (Vo) at an amplifier output, comprising:
    a voltage amplifier,
    a pair of voltage reference terminals, and
    first and second output stages connected to provide feedback for said voltage amplifier, said first output stage providing more capacitive AC feedback than said second output stage, and said second output stage providing resistive DC feedback with a Vo range approximating the voltage differential between said voltage reference terminals.

11. A voltage amplifier circuit for producing an output voltage (Vo) at an amplifier output, comprising:
    a voltage amplifier,
    a pair of voltage reference terminals, and
    first and second output stages connected to provide feedback for said voltage amplifier, said first output stage providing more AC feedback than said second output stage, and said second output stage providing DC feedback with a Vo range approximating the voltage differential between said voltage reference terminals,
    wherein said first output stage is connected through a feedback capacitor to said voltage amplifier and said second output stage is connected through a feedback resistor to said voltage amplifier.

12. The voltage amplifier circuit of claim 11, further comprising a blocking resistor connected between said feedback capacitor and feedback resistor.

13. The voltage amplifier circuit of claim 12, wherein said blocking resistor has a resistance value high enough to inhibit a phase shift at the output of said voltage amplifier relative to its input that could result in oscillation, but small enough so that the transistors of said second output stage are in their linear range for high values of Vo.

14. The voltage amplifier circuit of claim 10, said first and second output stages comprising respective pairs of CMOS transistors connected between said voltage reference terminals and controlled by the output of said voltage amplifier.

15. The voltage amplifier circuit of claim 14, wherein said first output stage is connected to said amplifier circuit output through said blocking impedance.

16. The voltage amplifier circuit of claim 14, wherein the CMOS transistors of said second output stage are larger in size than the CMOS transistors of said first output stage.

17. The voltage amplifier circuit of claim 16, wherein said first output stage dominates said second output stage for low values of Vo and said second output stage dominates said first output stage for high values of Vo approaching the voltage differential between said voltage reference terminals, and the size ratio between the transistors of said second output stage and the transistors of said first output stage is sufficient for the transistors of said second output stage to be in their linear range when said stage is dominant.

18. The voltage amplifier circuit of claim 10, said voltage amplifier comprising an operational amplifier.

19. A voltage amplifier circuit, comprising:
a pair of voltage reference terminals for establishing a rail-to-rail voltage,
an operational amplifier connected between said voltage reference terminals, said operational amplifier having an output comprising positive and negative op amp outputs, an inverting input, and a non-inverting input,
first and second output stages comprising respective PMOS/INMOS transistor pairs respectively connected in series between said voltage reference terminals, with said PMOS and NMOS transistors controlled by said positive and negative op amp outputs, respectively,
a blocking resistor connected between PMOS/NMOS junctions of said first and second output stages,
an output terminal at the PMOS/NMOS junction of said second output stage for supporting a voltage amplifier circuit output voltage Vo,
a feedback capacitor connected between the PMOS/NMOS junction of said first output stage and the inverting input of said operational amplifier, and
a feedback resistor connected between the PMOS/NMOS junction of said second output stage and the inverting input of said operational amplifier.

20. The voltage amplifier circuit of claim 19, wherein said blocking resistance value is high enough to inhibit a phase shift at the outputs of said operational amplifier relative to its non-inverting input that could result in oscillation, but small enough so that the transistors of said second output stage are in their linear range for values of Vo approaching rail-to-rail.

21. The voltage amplifier circuit of claim 19, wherein the transistors of said second output stage are larger in size than the transistors of said first output stage.

22. The voltage amplifier circuit of claim 21, wherein the size ratio between the transistors of said second output stage and the transistors of said first output stage is sufficient for the transistors of said second output stage to be in their linear range for high values of Vo approaching rail-to-rail.

23. The voltage amplifier circuit of claim 19, further comprising a gain resistor connected to the inverting input of said operational amplifier.

24. A voltage amplifier circuit for producing an output voltage (Vo) at an amplifier circuit output, comprising:
a voltage amplifier, first and second output stages between the output of said voltage amplifier and said amplifier circuit output,
an AC feedback circuit between said first output stage and said voltage amplifier,
a DC feedback circuit between said second stage and said voltage amplifier, and
a blocking impedance connected to block load capacitance from said AC feedback circuit during high frequency operation, and to enter said DC feedback circuit during low frequency operation so that it does not increase the voltage amplifier circuit's output impedance.

25. The voltage amplifier circuit of claim 24, said AC feedback circuit comprising a feedback capacitance.

26. The voltage amplifier circuit of claim 25, said DC feedback circuit comprising a feedback resistance.

27. The voltage amplifier circuit of claim 26, wherein said blocking impedance comprises a blocking resistance that is connected in series between said feedback capacitance and said feedback resistance, and said amplifier circuit output is taken from the junction of said blocking and feedback resistances.

28. The voltage amplifier circuit of claim 24, further comprising voltage reference terminals for said output stages, said output stages comprising respective pairs of CMOS transistors connected between said voltage reference terminals and controlled by said voltage amplifier output, said blocking impedance connected between said second output stage and the remainder of said first output stage.

29. The voltage amplifier circuit of claim 28, wherein said blocking impedance comprises a resistor that has a resistance value high enough to inhibit a phase shift at the output of said voltage amplifier relative to its input that could result in oscillation, but small enough so that the transistors of said second output stage are in their linear range when said stage is dominant.

30. The voltage amplifier circuit of claim 28, wherein said first output stage is connected to said amplifier circuit output through said blocking impedance.

31. The voltage amplifier circuit of claim 28, wherein the CMOS transistors of said second output stage are larger in size than the CMOS transistors of said first output stage.

32. The voltage amplifier circuit of claim 31, wherein the size ratio between the transistors of said second output stage and the transistors of said first output stage is sufficient for the transistors of said second output stage to be in their linear range when said stage is dominant.

33. The voltage amplifier circuit of claim 28, said voltage amplifier comprising an operational amplifier.

34. The voltage amplifier circuit of claim 28, said blocking impedance comprising a resistor.

35. The voltage amplifier circuit of claim 1, said AC feedback circuit comprising a feedback capacitance.

36. The voltage amplifier circuit of claim 35, said DC feedback circuit comprising a feedback resistance.

37. The voltage amplifier circuit of claim 36, wherein said blocking impedance comprises a blocking resistance that is connected in series between said feedback capacitance and said feedback resistance, and said amplifier circuit output is taken from the junction of said blocking and feedback resistances.

* * * * *